(12) United States Patent
Matsunaga et al.

(10) Patent No.: US 8,497,026 B2
(45) Date of Patent: Jul. 30, 2013

(54) POROUS METAL FOIL AND PRODUCTION METHOD THEREFOR

(75) Inventors: Tetsuhiro Matsunaga, Ageo (JP); Hajime Watanabe, Ageo (JP); Joe Nishikawa, Ageo (JP); Tetsuro Sato, Minamisaitama-Gun (JP)

(73) Assignee: Mitsui Mining & Smelting Co., Ltd., Shinagawa-Ku (JP)

( * ) Notice: Subject to any disclaimer, the term of this patent is extended or adjusted under 35 U.S.C. 154(b) by 0 days.

(21) Appl. No.: 13/254,733

(22) PCT Filed: Jun. 25, 2010

(86) PCT No.: PCT/JP2010/060872
§ 371 (c)(1),
(2), (4) Date: Sep. 2, 2011

(87) PCT Pub. No.: WO2011/067957
PCT Pub. Date: Jun. 9, 2011

(65) Prior Publication Data
US 2011/0318600 A1 Dec. 29, 2011

(30) Foreign Application Priority Data
Dec. 4, 2009 (JP) .................... 2009-276649

(51) Int. Cl.
*B32B 5/18* (2006.01)
(52) U.S. Cl.
USPC ........... 428/550; 428/605; 428/613; 429/233; 429/235; 429/236; 429/241

(58) Field of Classification Search
USPC ................................. 428/605, 613
See application file for complete search history.

(56) References Cited

U.S. PATENT DOCUMENTS

| 4,383,896 A | 5/1983 | Pruyn et al. |
| 5,030,233 A * | 7/1991 | Ducheyne ............... 623/23.54 |
| 2004/0115536 A1 * | 6/2004 | Blankenborg et al. ........ 429/245 |
| 2010/0021695 A1 | 1/2010 | Naoyuki et al. |

FOREIGN PATENT DOCUMENTS

| EP | 1 038 994 | 9/2000 |
| GB | 2 320 724 | 7/1998 |
| JP | 50-141540 | 11/1975 |
| JP | 56-166388 | 12/1981 |
| JP | 01-104878 | 4/1989 |
| JP | 05-023760 | 2/1993 |
| JP | 08-236120 | 9/1996 |
| JP | 09-045334 | 2/1997 |
| JP | 10-195689 | 7/1998 |
| JP | 3262558 | 3/2002 |
| JP | 2002-263962 A1 | 9/2002 |
| JP | 2005-251429 | 9/2005 |
| JP | 2005-320562 | 11/2005 |
| JP | 2008-001936 A1 | 1/2008 |
| JP | 2008-277376 A1 | 11/2008 |
| WO | WO 0200966 * | 1/2002 |
| WO | 2008/081904 A1 | 7/2008 |
| WO | WO2010034949 * | 4/2010 |

* cited by examiner

*Primary Examiner* — Jennifer McNeil
*Assistant Examiner* — Daniel J Schleis
(74) *Attorney, Agent, or Firm* — Burr & Brown (57) ABSTRACT

A porous metal foil of the present invention comprises a two-dimensional network structure composed of metal fibers. This porous metal foil has superior properties and can be obtained in a highly productive and cost effective manner.

20 Claims, 6 Drawing Sheets

FIG. 11 ately simple
POROUS METAL FOIL AND PRODUCTION METHOD THEREFOR

CROSS-REFERENCE TO RELATED APPLICATION

This application claims priority to Japanese Patent Application No. 2009-276649 filed on Dec. 4, 2009, the entire content of which is incorporated herein by reference.

FIELD OF THE INVENTION

The present invention relates to a porous metal foil and a method for producing the porous metal foil.

BACKGROUND OF THE INVENTION

In recent years, lithium-ion secondary batteries and lithium-ion capacitors have been drawing attention as electric storage devices for use in mobile electronic devices such as mobile phones or laptop personal computers, electric vehicles, and hybrid vehicles. As anode current collectors for such electric storage devices, porous metal foils are used or are being considered for use. This is because making the foil porous provides benefits such that the weight of the foil can be reduced (to improve fuel consumption in automobiles), that adhesive power of an active material can be improved by anchoring effect making use of the pores, and that pre-doping of lithium ions (e.g., vertical pre-doping) can be efficiently conducted by making use of the pores.

Known methods for producing such porous metal foils include (1) a method of masking the surface of a substrate in a desired pattern with an insulating film, onto which electrolytic plating is conducted to form pores in accordance with the pattern; (2) a method of providing the surface of a substrate with a specific surface roughness or a specific surface condition, onto which electrolytic plating is conducted to control nucleation; (3) a method of perforating a non-porous metal foil by etching or machining; and (4) a method of forming a three-dimensional network structure by techniques for producing metal foams or plating nonwoven fabrics.

In particular, various techniques have been proposed for the above method of (2) since its steps are relatively simple and suitable for mass production. For example, Patent Literature 1 discloses a method for producing a fine-porous metal foil by subjecting an anode having a surface roughness Rz of 0.8 μm or less to electrolytic plating. Patent Literature 2 discloses a method comprising forming an oxidized film on the surface of a cathode body made of titanium or a titanium alloy by anode oxidization method; electro-depositing copper on the surface of the cathode body to form a porous copper foil; and peeling the foil from the cathode body. Patent Literature 3 discloses a method for producing a porous metal foil provided with an aluminum alloy carrier, comprising forming even projections by etching aluminum; and gradually growing metal particles from the projections as cores for electro-deposition so as to connect the metal particles.

However, the actual situation is that the porous metal foils produced in accordance with these techniques fail to achieve a sufficiently high aperture ratio due to a concern that the foil strength would be lowered. In addition, a long foil is difficult to produce, and anode oxidation process had problems with the peelability of the porous metal foil and the stability of the aperture ratio, in that continuous peeling of the foil destroys the oxidized film. In particular, a higher aperture ratio is required for anode current collectors of electric storage devices, such as lithium-ion secondary batteries and lithium-ion capacitors, with improvement in performance.

CITATION LIST

Patent Literature

[PTL 1] Japanese Patent Laid-Open Publication No. H10-195689
[PTL 2] Japanese Patent Publication No. 3262558
[PTL 3] Japanese Patent Laid-Open Publication No. 2005-251429

SUMMARY OF THE INVENTION

The inventors have currently found that implementation of metal plating on a certain type of peelable layer in which cracks are formed makes it possible to obtain a porous metal foil having superior properties in a highly productive and cost effective manner.

Thus, an object of the present invention is to obtain a porous metal foil having superior properties in a highly productive and cost effective manner.

According to the present invention, there is provided a porous metal foil comprising a two-dimensional network structure composed of a metal fiber.

According to the present invention, there is also provided a porous metal foil product comprising:
   an electrically conductive substrate;
   a peelable layer provided on the electrically conductive substrate; and
   a porous metal foil provided on the peelable layer,
wherein the peelable layer allows the porous metal foil to be peeled off from the peelable layer.

According to the present invention, there is further provided a method for producing a porous metal foil, comprising the steps of:
   forming a peelable layer on an electrically conductive substrate, wherein a crack is generated in the peelable layer; and
   plating the peelable layer with a metal capable of depositing preferentially on the crack, to grow numerous metal particles along the crack, so that the porous metal foil comprising a two-dimensional network structure composed of a metal fiber is formed.

DETAILED DESCRIPTION OF THE INVENTION

Porous Metal Foil

Figure 1:
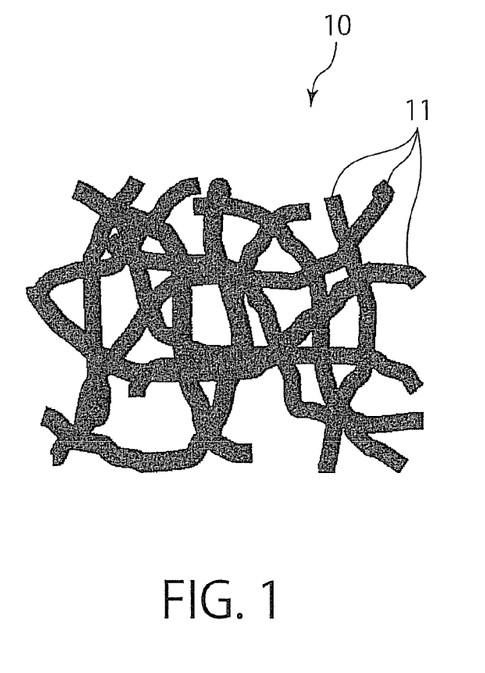
FIG. 1 is a schematic top view of an example of the porous metal foil according to the present invention.

FIG. 1 shows a schematic top view of an example of the porous metal foil according to the present invention. As shown in FIG. 1, the porous metal foil 10 according to the present invention comprises a two-dimensional network structure composed of a metal fiber 11. This porous metal foil 10 has an aperture ratio of preferably 3 to 80%, more preferably 5 to 60%, further preferably 10 to 55%, and still further preferably 20 to 55%. The aperture ratio P (%) is defined herein as:

$$P = 100 - [(W_p/W_n) \times 100]$$

wherein $W_p/W_n$ is the ratio of the weight $W_p$ of a porous metal foil to the theoretical weight $W_n$ of a non-porous metal foil having a composition and a size which are identical to those of the porous metal foil. This theoretical weight $W_n$ may be calculated by measuring the size of the porous metal foil obtained; calculating the volume (i.e., the theoretical volume of the non-porous metal foil) from the measured size; and then multiplying the resultant volume by the density of the material of the porous metal foil prepared.

In this way, in the porous metal foil 10 of the present invention, it is possible to achieve a high strength based on the numerous metal fibers 11 which are networked in a two-dimensional manner, even if the aperture ratio is set higher. Therefore, it is possible to raise the aperture ratio to a level that has never been achieved, without concern for strength decrease. For example, the porous metal foil 10 may have a tensile strength of preferably not less than 10N/10 mm, more preferably not less than 15N/10 mm, as measured according to the later-described measuring method, thus making it possible to effectively prevent the porous metal foil from breaking. However, in the case where the porous metal foil is handled with a carrier attached to the foil, a tensile strength lower than the above ranges are of no problem. In this case, it is possible to maximize the aperture ratio without concern for tensile strength.

The porous metal foil 10 has a thickness of preferably 3 to 40 μm, more preferably 3 to 30 μm, further preferably 5 to 25 μm, still further preferably 10 to 20 μm, most preferably 10 to 15 μm. Within these ranges, a superior balance is achieved between high aperture ratio and high strength. The thickness of the porous metal foil corresponds to the maximum cross-sectional height of the metal fiber, since the porous metal foil of the present invention comprises the two-dimensional network structure composed of the metal fiber. The thickness is preferred to be measured by a commercially available film-thickness measuring device having a spindle which is larger than the pore sizes of the porous metal foil.

The metal fiber 11 is a fiber made of metal, and the metal to be used may be suitably chosen depending on the intended use and is not particularly limited. Preferred metal comprises at least one selected from the group consisting of copper, aluminum, gold, silver, nickel, cobalt, and tin. The term "comprise" means that it embraces metal or alloy mainly containing metal element(s) as listed above, which may include other metal element(s) and unavoidable impurities as the balance, and preferably means that metal element(s) as listed above constitutes not less than 50% by weight of the metal or alloy, with a typical example being metal or alloy consisting of metal element(s) as listed above and unavoidable impurities. The above definition will be equally applied to similar expressions described hereinbelow with regard to metal. Among these metals, metal or alloy suitable for anode current collectors of electric storage devices, such as lithium-ion secondary batteries and lithium-ion capacitors, includes metal or alloy comprising at least one selected from the group consisting of copper, copper alloys, nickel, cobalt, and tin, preferably copper. In particular, the two-dimensional network structure is preferred to have an irregular shape derived from a crack, which has been formed on the surface of a substrate.

The fiber diameter of the metal fiber 11 is preferred to be 5 to 80 μm, more preferably 5 to 50 μm, further preferably 8 to 30 μm, most preferably 10 to 20 μm. The term "fiber diameter" is defined as the width (thickness) of the fiber 11 when the porous metal foil is viewed from straight above, and can be measured by using field emission scanning electron microscope (FE-SEM), scanning ion microscope (SIM) or the like. Within these ranges, a superior balance is achieved between high aperture ratio and high strength.

Figure 2:
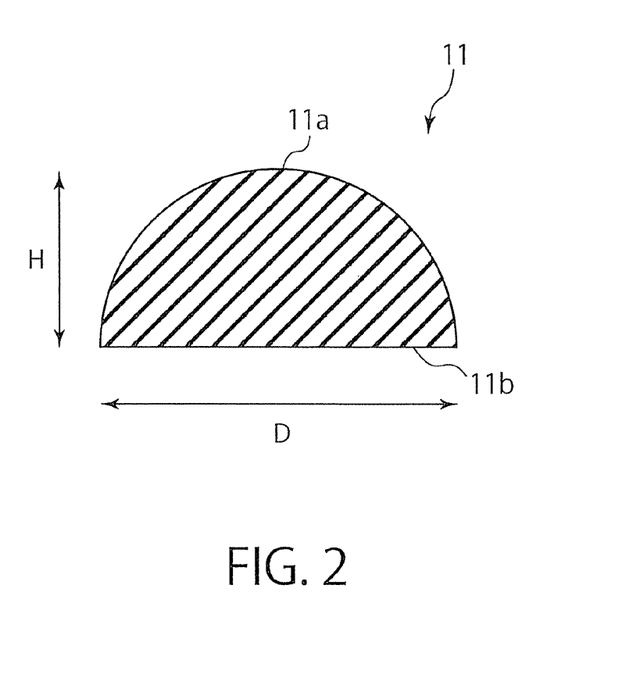
FIG. 2 is a schematic cross-sectional view of the metal fiber composing the porous metal foil according to the present invention.

According to a preferred embodiment of the present invention, as shown in FIG. 1, the metal fiber 11 is a branched fiber, which is irregularly networked to constitute the porous metal foil 10. The fiber 11 is formed by numerous metal particles being connected to each other, resulting from nucleation along the later-mentioned crack in the peelable layer. Since it is desirable for the adjacent metal particles to tightly connect with each other through particle growth in order to constitute the metal fiber, the metal particles constituting the metal fiber may no longer have the complete shapes of the particles. In addition, as shown in FIG. 2, the metal particles constituting the metal fiber 11 typically have hemispherical shapes having spherical parts 11a and bottom parts 11b. The bottom parts 11b of all the metal particles are positioned on the same basal plane, while the spherical parts 11a of all the metal particles are positioned to the same side with reference to the basal plane. In this case, the width D of the bottom part 11b along the basal plane is the fiber diameter, while the maximum cross-sectional height H of the spherical part 11a corresponds to the thickness of the porous metal foil. This basal plane and the bottom part 11b positioned thereon have a shape corresponding to the flat plane shape of the peelable layer which is used during the production, although they are not limited to this shape when the foil is produced by other production methods. According to the inventors' experience, the average ratio of the maximum cross-sectional height H to the fiber diameter D of the fiber 11 is, but not limited to, typically 0.30 to 0.70, more typically 0.40 to 0.60, further typically 0.45 to 0.55, most typically about 0.50, and may be adjusted by modifying the plating conditions or the like as appropriate. In addition, according to the inventors' experience, the average area of the pores in the porous metal foil 10 is, but not limited to, typically 3 to 5000 $\mu m^2$, more typically 3 to 3000 $\mu m^2$, further typically 3 to 2000 $\mu m^2$. Furthermore, according to the inventors' experience, in the porous metal foil 10, the ratio of the number of pores having areas of not more than one-half of the largest pore area to the number of the total pores is, but not limited to, typically not less than 60%, more typically not less than 70%, further typically not less than 80%.

Production Method

An example of the process for producing the porous metal foil according to the present invention will be described hereinbelow, while the porous metal foil according to the present invention is not limited to those produced by this production method but includes those produced by other production methods.

Figure 3:
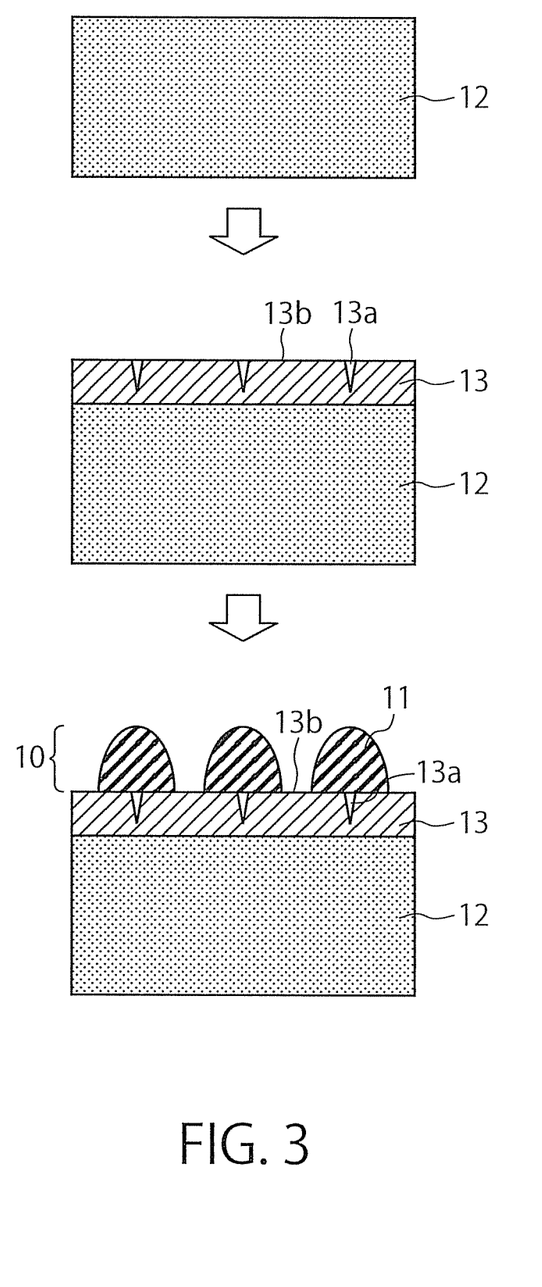
FIG. 3 is a flow diagram showing the flow of the process of producing the porous metal foil according to the present invention.

FIG. 3 shows the flow of the process of producing the porous metal foil according to the present invention. In the production method of the present invention, an electrically conductive substrate 12 is first provided as a support for producing the porous metal foil. The electrically conductive substrate may be a substrate having an electrical conductivity which enables plating thereon. Any of inorganic materials, organic materials, laminates, and materials having metallic surfaces can be used as the substrate, with metals being preferred. Preferred examples of such metals include metals, such as copper, nickel, cobalt, iron, chromium, tin, zinc, indium, silver, gold, aluminum, and titanium, and alloys containing at least one of these metal elements, more preferred examples being copper, copper alloys, nickel, nickel alloys, titanium, titanium alloys, and stainless steels. The configuration of the electrically conductive substrate is also not limited, allowing the use of substrates with various configurations including foil, plate, and drum. In the case of drum, an electrically conductive metal plate may be used with the plate being wrapped around the drum. The thickness of the electrically conductive metal plate in this case is preferred to be 1 to 20 mm. The electrically conductive substrate supports the produced porous metal foil during its processing or until just before its use, thus improving the handleability of the porous metal foil. In particular, it is preferable to use a metal foil as the electrically conductive substrate since there are advantages in that the metal foil used as the electrically conductive substrate can be reused as it is after the production of the porous metal foil, or can be recycled through melting and foil production. In this case, the thickness of the metal foil is preferred to be 10 $\mu m$ to 1 mm as ensuring a strength which prevents wrinkles or twists and the like from generating during the metal foil production process and the subsequent processing-and-transporting process or the like.

The shape of the crack in the peelable layer varies depending on the material and roughness of the electrically conductive substrate, and thus may change the properties of the porous metal foil, such as aperture ratio. On the other hand, it is a matter of course that the shape of the porous metal foil may change even depending on the type or conditions of the metal plating. In order to obtain a desired porous metal foil in consideration of these, selection of the electrically conductive substrate and setting the conditions for forming the peelable layer and/or those for plating may be done suitably depending on the necessity.

The peelable layer 13 is then formed on the electrically conductive substrate 12, with cracks 13a being generated in the peelable layer 13. Prior to the formation of the peelable layer 13, it is preferred to conduct pretreatment, such as acid washing and degreasing, to the electrically conductive substrate 12 to cleanse its surface. The peelable layer 13 is a layer which facilitates the peeling of the porous metal foil 10 to be formed thereon, and is composed of a material which is capable of generating the cracks 13a and has a tendency of being easily plated at the cracks 13a as well as being hardly plated at regions 13b where no cracks exist. That is, a material which allows a certain type of metal to preferentially deposit on the generated cracks 13a by plating is used as the peelable layer 13. In addition, this peelable layer may be formed in a multilayered manner, in which cracks may be formed only in the upper layer or otherwise cracks may be formed not only in the upper layer but also in the lower layer(s). A diamond-like carbon (DLC) or the like may be present on the surface of the peelable layer. It is preferred to control formation of the cracks 13 so that cracks can spontaneously generate due to the stress in the peelable layer 13, although the cracks need not generate at the time of the formation of the peelable layer but may generate during the subsequent steps such as washing-and-drying process or machining process. Although cracks are usually undesirable, the production method of the present invention is characterized by rather taking advantage of the cracks in a positive way. In particular, since cracks usually have characteristics of being formed in a way such that branched lines are networked in a two-dimensional manner, forming metal fiber along the cracks can provide a porous metal foil having a high aperture ratio and a high strength. Since generation of cracks is always of concern in usual film-forming processes, those skilled in the art who engage in film forming is empirically familiar with the conditions for generating cracks, and can easily choose the conditions to the best of their experience and knowledge, for example by adjusting composition control of the plating bath or the like, thickness of the peelable layer, conditions of current density, bath temperature, stirring conditions, or post heating.

The peelable layer 13 comprises at least one selected from the group consisting of chromium, titanium, tantalum, niobium, nickel and tungsten or is composed of an organic material such as resins. The peelable layer is preferred to comprise at least one from chromium, titanium and nickel which have high hardness, in terms of continuous peelability, durability and corrosion resistance, and is more preferred to be composed of chromium, a chromium alloy or a chromium oxide in that it forms passive state, which facilitates the peeling. The thickness of the peelable layer 13 is preferred to be in the range of 1 nm to 100 $\mu m$, more preferably 0.1 to 50 $\mu m$, further preferably 1 to 30 $\mu m$, most preferably 2 to 15 $\mu m$. These compositions and thicknesses enables generation of cracks, while providing the peelable layer with a higher resistance in view of the electrically conductive substrate to facilitate the formation and peeling of the porous metal foil 10 which is to be formed on the peelable layer. Therefore, the peelable layer is desired to be composed of a material having a resistance higher than that of the electrically conductive substrate.

The peelable layer 13 can be formed by various film forming methods, which include, but not limited to, electrolytic plating, non-electrolytic plating, sputtering method, physical vapor deposition (PVD), chemical vapor deposition (CVD), sol-gel method, and ion-plating method. In terms of production efficiency or the like, it is preferable that the peelable layer 13 be also formed by electrolytic plating. As necessary, the peelable layer 13 may be further subjected to heat treatment and/or polishing, without departing from the spirit of the invention. Specifically, polishing is permitted to such an extent that the surface of the peelable layer 13 is merely cleansed, but it is a matter of course that polishing should not be conducted so excessively as to disfigure the cracks. Preferably, the peelable layer 13 thus obtained is washed with water or the like and then dried.

In the case of conducting chromium electrolytic plating, preferred chromium plating solutions include Sargent bath and hard chromium plating baths, more preferably hard chromium plating baths. Preferred examples of commercially available hard chromium plating baths include Anchor 1127 produced by Meltex Inc., HEEF-25 produced by Atotech, and Mac-1 produced by Nihon MacDermid Co., Ltd. The bath compositions and electrolytic conditions are shown below, although it is permitted to depart from the following ranges as far as a desired porous metal foil is obtained.

TABLE 1

Preferred Compositions of Chromium Plating Solutions and Electrolytic Conditions

|  | Basic Bath | Commercially Available Hard Chromium Plating Baths | | |
| --- | --- | --- | --- | --- |
|  | Sargent Bath | Anchor 1127 | HEEF-25 | Mac-1 |
| Bath Compositions (g/L) | | | | |
| Chromic Anhydride | 250 | 280-320 | 200-300 | 250-300 |
| Sulfuric Acid | 2.5 | 3.3-3.9 (1.1-1.3 wt %) | 2.0-4.5 | 3.5-4.0 |
| Electrolytic Conditions | | | | |
| Cathode Current Density (A/dm$^2$) | 20-40 | 30-60 | 20-90 | 10-100 |
| Temperature (° C.) | 45-60 | 55-60 | 50-65 | 55-60 |

A stable chromium plating bath typically contains a small amount of trivalent chromium, of which the amount is about 2 to 6 g/L. A catalyst such as an organic sulfonic acid may also be added to the hard chromium plating bath. The concentration of chromic anhydride can be controlled in terms of Baume degree. Furthermore, since impurities, such as iron, copper and chloride ion, affect the plating condition, attention needs to be paid to control the maximum amount of dissolved impurities. An anode used for the chromium plating is preferred to be titanium coated with lead oxide or with a Pb—Sn alloy. Typical examples of such commercially available anodes include Ti—Pb electrode (Sn: 5%) produced by SPF Co., Ltd. and Exceload LD produced by Japan Carlit Co., Ltd.

The peelable layer 13 is then plated with a metal capable of depositing preferentially on the cracks 13a, to grow numerous metal particles 11 along the cracks 13a, whereby the porous metal foil 10 comprising a two-dimensional network structure composed of a metal fiber is formed. As described above, the peelable layer 13 has the cracks 13a having a tendency of being easily plated thereon and the crack-free regions 13b having a tendency of being hardly plated thereon. The reason why the cracks 13a tend to be easily plated is that current flows more easily in parts where the cracks 13a exist than in regions 13b where no such cracks exist, resulting in preferential occurrence of nucleation and its growth on the cracks 13a. The metal capable of depositing preferentially on the cracks 13a preferably comprises at least one selected from the group consisting of copper, aluminum, gold, silver, nickel, cobalt, and tin, more preferably at least one selected from the group consisting of copper, silver, and gold, further preferably copper.

The porous metal foil 10 can be formed by plating methods with no particular limitation, which include electrolytic plating and non-electrolytic plating, between which electrolytic plating is preferable since it enables metal to deposit on the cracks 13a efficiently. The plating conditions may be determined in accordance with known methods and are not particularly limited. For example, copper plating is preferred to be conducted in a copper sulfate plating bath. In the copper plating, preferred plating bath compositions and electrodepositing conditions include, but not limited to, copper sulfate pentahydrate in a concentration of 120 to 350 g/L; sulfuric acid in a concentration of 50 to 200 g/L; a cathode current density of 10 to 80 A/dm$^2$; and a bath temperature of 40 to 60° C.

An additive agent may be suitably added to the plating solution to enhance properties of the metal foil. In the case of copper foil, for example, preferred examples of such additive agent includes hide glues, gelatins, chlorine, sulfur-containing compounds such as thiourea, synthesized additive agents such as polyethylene glycols. With these preferred additive agents, it is possible to control dynamic properties and surface condition of the metal foil. The concentration of the additive agent is not limited but is normally in the range of 1 to 300 ppm.

Finally, the porous metal foil is peeled off from the electrically conductive substrate having the peelable layer to obtain an independent porous metal foil. The peeled foil may be transferred to another substrate such as a film provided with an adhesive layer thereon. This peeling step, however, is not essential, and the foil may be configured so that it can be handled as a porous metal foil product which remains provided with the substrate via the peelable layer and may not be peeled off until just before use. In this case, the porous metal foil can be more easily handled, while it becomes possible to significantly increase the aperture ratio or significantly reduce the film thickness because high strength is not so required due to the support by the substrate.

Applications

Typical applications of the porous metal foil according to the present invention include anode current collectors of electric storage devices, such as lithium-ion secondary batteries and lithium-ion capacitors. Alternatively, the porous metal foil can be used in various applications, such as screening devices for fine-powder classification or solid-liquid separation, catalyst carriers, nets to be used in oxygen inlets of microorganism storage containers, dust-proof filters for clean rooms, antibacterial filters for liquids, filters for liquid reforming, electromagnetic-wave shields, magnetic materials, electrically conductive materials, and decoration sheets. For example, when the porous metal foil is used as an inner layer of a printed board to work as an electrically conductive material or the like, it is possible, through the pores, to release a gas derived from a resin, a solvent or the like, so that generation of blisters can be prevented. In addition, using the porous metal foil for forming circuits as an electrically conductive material or the like can attain weight reduction of the circuits by reducing the metal usage.

EXAMPLES

The present invention will be explained in more detail below with reference to Examples.

Example A1

Preparation of Porous Metal Foil

Copper foil having a thickness of 35 μm was prepared as an electrically conductive substrate. A chromium plating for forming a peelable layer was performed on the copper foil in the following manner. At the outset, the copper foil was immersed for 2 minutes at 40° C. in an acidic cleaner for printed-wiring board (PAC-200 produced by Murata Co., Ltd.) of which the concentration was adjusted to 120 ml/L with added water. The copper foil thus cleansed was immersed in 50 ml/L sulfuric acid at room temperature for 1 minute to be made acid-activated. The acid-activated copper foil was immersed in a chromium plating bath in which 180 g/L Econo-Chrome 300 (produced by Meltex Inc.) and 1 g/L pure concentrated sulfuric acid were dissolved, and was subjected to a chromium plating for 15 minutes under the conditions of a temperature of 45° C. and a current density of 20 A/dm². The copper foil on which the chromium plating was formed was washed with water and then dried. The thickness of the resultant chromium plating was about 2 μm as measured by XRF (X-ray fluorescence analysis). Numerous cracks, which would have been formed by plating stress, were confirmed on the surface of the chromium plating.

A copper sulfate plating was performed on the chromium plating where the cracks generated. In this copper sulfate plating, the chromium-plated copper foil was immersed in a copper sulfate plating bath in which 250 g/L copper sulfate pentahydrate (having a copper concentration of about 64 g/L) and 80 g/L sulfuric acid were dissolved, and plated under the conditions including a current density of 20 A/dm²; a plating time of 150 seconds; an anode being DSE (insoluble electrode for generating oxygen); and a bath temperature of 40° C. During the plating, since current flows more easily on the crack part than on the outermost surface of the chromium plating, copper particles originating from the cracks have grown. As a result, a two-dimensional network structure composed of copper fibers was formed, as a porous metal foil, on the chromium plating. Finally, the porous metal foil was physically peeled off from the chromium plating to obtain an isolated porous metal foil.

Example A2

Observation on Porous Metal Foil

Figure 4:
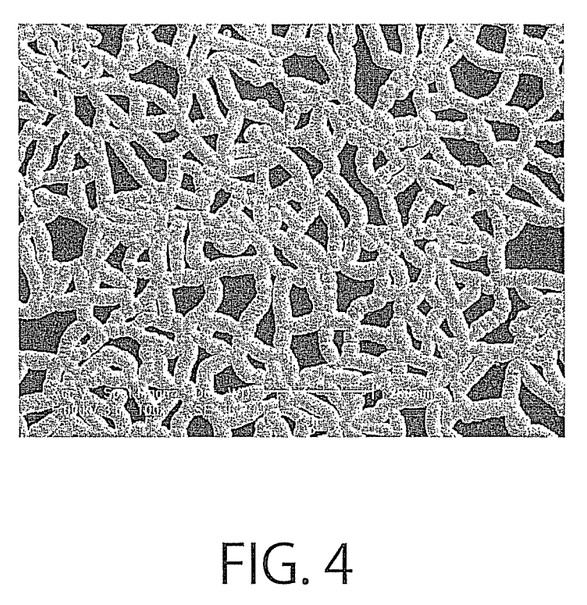
FIG. 4 is an FE-SEM image obtained in Example A2 by observing the surface which did not contact the peelable layer of the porous metal foil according to the present invention, from straight above (at a tilt angle of 0°).
Figure 5:
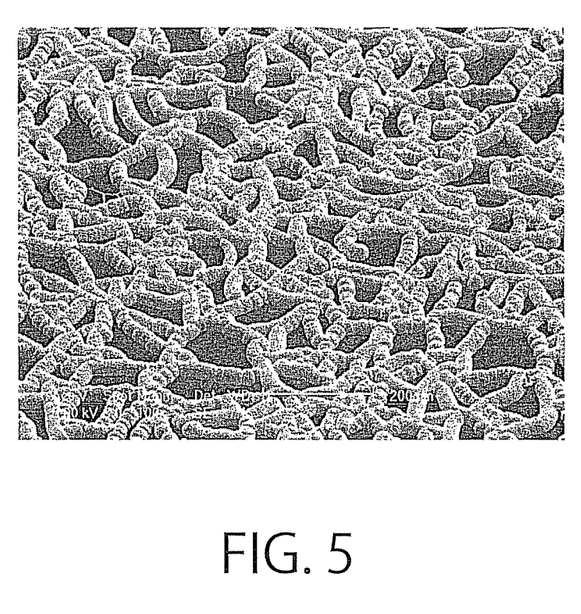
FIG. 5 is an FE-SEM image obtained in Example A2 by observing the surface which did not contact the peelable layer of the porous metal foil according to the present invention, from obliquely above (at a tilt angle of 45°).
Figure 6:
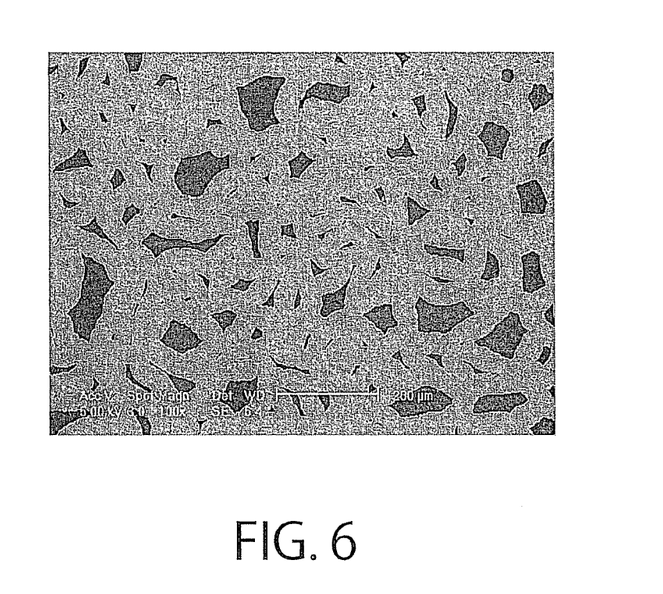
FIG. 6 is an FE-SEM image obtained in Example A2 by observing the surface which contacted the peelable layer of the porous metal foil according to the present invention, from straight above (at a tilt angle of 0°).
Figure 7:
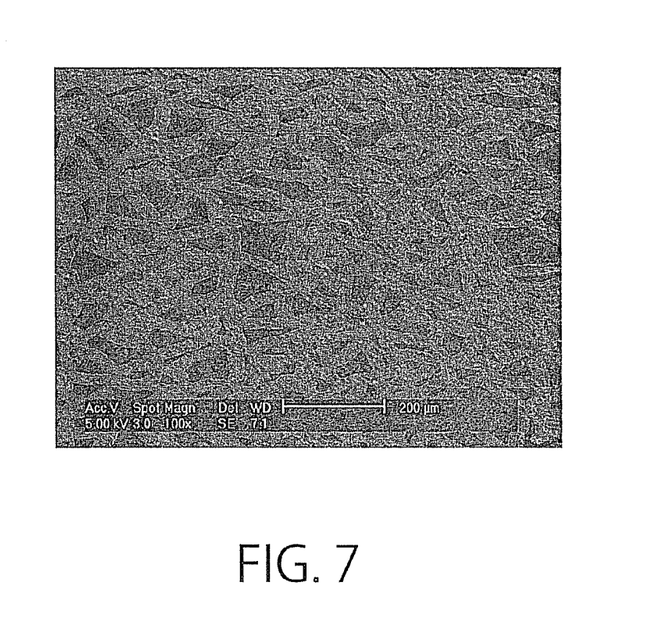
FIG. 7 is an FE-SEM image obtained in Example A2 by observing the surface which contacted the peelable layer of the porous metal foil according to the present invention, from obliquely above (at a tilt angle of 45°).

The porous metal foil obtained in Example A1 was observed by a field emission-scanning electron microscope (FE-SEM) from different angles. At the outset, the side which had not been in contact with the peelable layer of the porous metal foil (hereinafter, growth side) was observed from straight above (at a tilt angle of 0°) and obliquely above (at a tilt angle of 45°) to obtain images shown in FIGS. 4 and 5, respectively. After the porous metal foil was turned back, the other side which had been in contact with the peelable layer of the porous metal foil (hereinafter, peelable side) was also observed from straight above (at a tilt angle of 0°) and obliquely above (at a tilt angle of 45°) to obtain images shown in FIGS. 6 and 7, respectively. As is clear from these figures, beaded irregularities derived from the spherical parts of the metal particles was observed on the growth side, while a plane derived from the bottom part of the metal particles and center lines formed along the cracks were observed on the peelable side.

Figure 8:
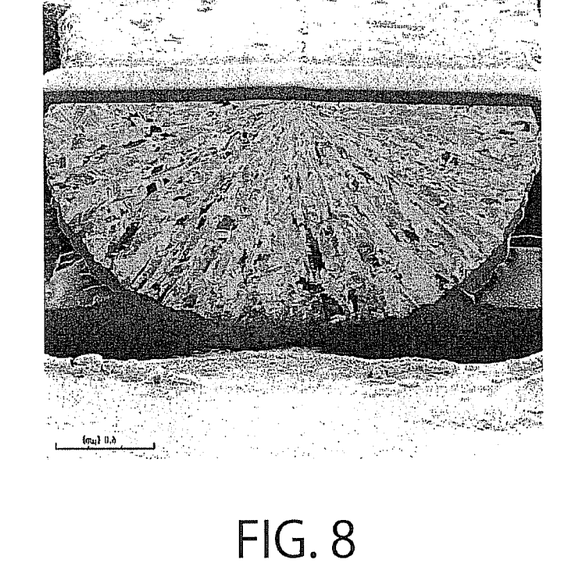
FIG. 8 is a SIM image obtained in Example A2 by observing the cross-sectional surface formed by vertically cutting the metal fiber composing the porous metal foil according to the present invention, at a tilt angle of 60°.

Furthermore, a cross-sectional surface of the metal fiber of the porous metal foil was observed by a scanning ion microscope (SIM) to obtain an image shown in FIG. 8, after having been processed by a focused ion beam processing apparatus (FIB). As shown in this figure, it was observed that the cross-sectional structure of the metal fiber had been created by deposition occurred radically from the crack as a starting point, and that the cross-sectional shape of the metal fiber was in the form of a semilunar including a spherical part and a flat bottom. The fiber diameter (thickness) of the metal fiber was 30 μm as calculated by using the scales shown in these figures. The ratio of the maximum cross-sectional height H to the fiber diameter D at the cross-sectional surface of the metal fiber was calculated to be about 0.50. The number of pores per unit area was about 300 mm$^{-2}$. The largest pore area observed was about 4700 μm², while the ratio of the number of pores having pore areas not more than one-half of the largest pore area (i.e., not more than about 2350 μm²) to the number of the total pores was about 90%.

Example A3

Measurement of Aperture Ratio

The aperture ratio of the porous metal foil obtained in Example A1 was determined by weight method in the following manner. At the outset, the thickness of the porous metal foil was measured to be 14.7 μm by a digital length measuring system (Digimicro MH-15M manufactured by Nikon Corporation). In this measurement, MS-5C (manufactured by Nikon Corporation) was used as a measuring stand, while a spindle which is the standard equipment of Digimicro MH-15M was used. The unit weight per 100 mm×100 mm square of the foil was measured to be 0.94 g. On the other hand, the theoretical weight of a non-porous copper foil having a thickness of 14.7 μm and an area of 100 mm×100 mm square was calculated to be 1.31 g, using the copper density of 8.92 g/cm³. With these values, the aperture ratio of the porous metal foil was calculated to be 28% as shown below.

$$\text{(Aperture ratio)} = 100 - [(\text{Unit weight of the sample})/$$
$$(\text{Theoretical weight of the non-porous copper foil})] \times 100$$
$$= 100 - [(0.94)/(1.31)] \times 100$$
$$= 28\%$$

Example A4

Measurement of Tensile Strength

Figure 9:
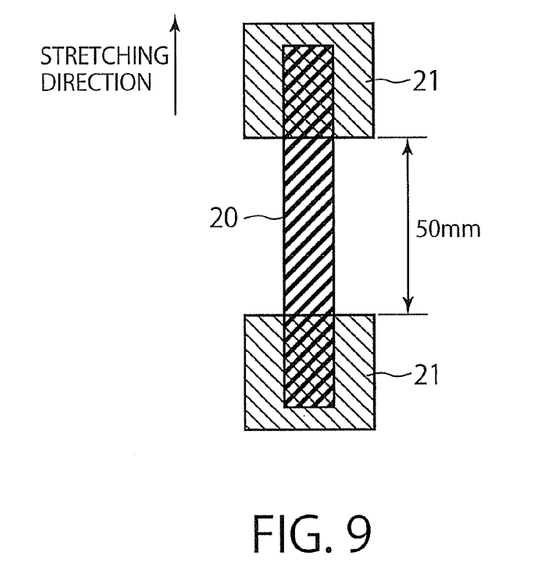
FIG. 9 is a schematic view showing the fixation of a metal foil sample to fixtures in the tensile strength test conducted in Example A4.

The tensile strength of the porous metal foil obtained in Example A1 was measured in accordance with JIS C 6511 as shown below. At the outset, a test piece having a size of 10 mm×100 mm was cut off from the porous metal foil. As shown in FIG. 9, this test piece 20 was fixed with its both ends being held by an upper fixture 21 and a lower fixture 21 of a tensile strength tester (Autograph manufactured by Shimadzu Corporation) so that the distance between the two fixtures could be 50 mm. The tensile strength was then measured by stretching the test piece at a tension rate of 50 mm/minute. In this measurement, a load cell of 1 kN was used in the tensile strength tester. As a result, the tensile strength was 15 N/10 mm width. The percentage of elongation of the test piece during the measurement was 0.8%. From this result, the porous metal foil according to the present invention is considered to have a strength endurable for practical use.

Example B1

Preparation of Porous Metal Foil

A stainless steel plate made of SUS304 was prepared as an electrically conductive substrate. A chromium plating for forming a peelable layer with a thickness of 2 μm was performed on the stainless steel plate in the following manner. At the outset, the stainless steel plate was immersed for 2 minutes at 40° C. in an acidic cleaner for printed-wiring board (PAC-200 produced by Murata Co., Ltd.) of which the concentration was adjusted to 120 ml/L with added water. The stainless steel plate thus cleansed was immersed in 50 ml/L sulfuric acid at room temperature for 1 minute to be made acid-activated. The acid-activated stainless steel plate was immersed in a commercially available hard chromium plating bath (HEEF-25 produced by Atotech), and was subjected to a chromium plating under the conditions of a cathode current density of 20 A/dm$^2$; an electrolysis time of 400 seconds; a bath temperature of 45° C.; a coulomb amount of 8000 C/dm$^2$; an electrode area of 1.2 dm$^2$; and a distance between electrodes of 90 mm. The stainless steel plate on which the chromium plating was formed was washed with water and then dried. The thickness of the resultant chromium plating was about 2 μm as measured by XRF (X-ray fluorescence analysis). Numerous cracks, which would have been formed by plating stress, were confirmed on the surface of the chromium plating.

A silver plating was performed on the chromium plating where the cracks generated. In this silver plating, the chromium-plated stainless steel plate was immersed in a commercially available silver plating bath (Selenabright C produced by Japan Pure Chemical Co., Ltd.), in which 25 g/L potassium cyanide, silver potassium cyanide (50 g/L as silver), a phosphate and the like were dissolved, and plated under the conditions including a cathode current density of 1.0 A/dm$^2$; an electrolysis time of 469 seconds; and a bath temperature of 40° C. During the plating, since current flows more easily on the crack part than on the outermost surface of the chromium plating, silver particles originating from the cracks have grown. As a result, a two-dimensional network structure composed of silver fibers was formed, as a porous metal foil, on the chromium plating. Finally, the porous metal foil was physically peeled off from the chromium plating to obtain an isolated porous metal foil.

Example B2

Observation on Porous Metal Foil

Figure 10:
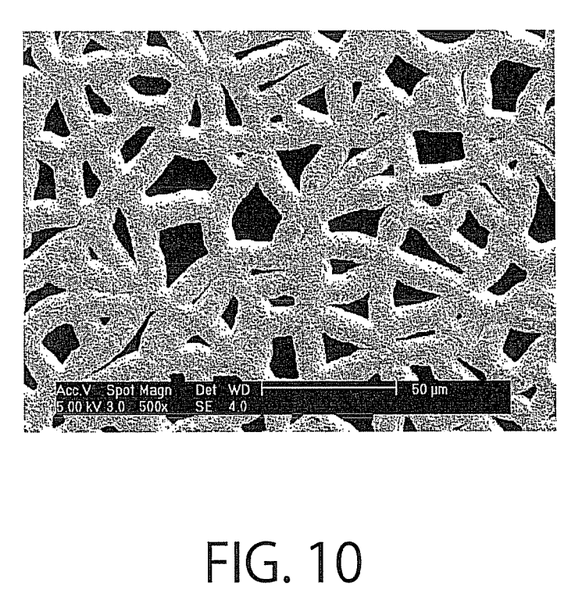
FIG. 10 is an FE-SEM image obtained in Example B2 by observing the surface which did not contact the peelable layer of the porous metal foil according to the present invention, from straight above (at a tilt angle of 0°).
Figure 11:
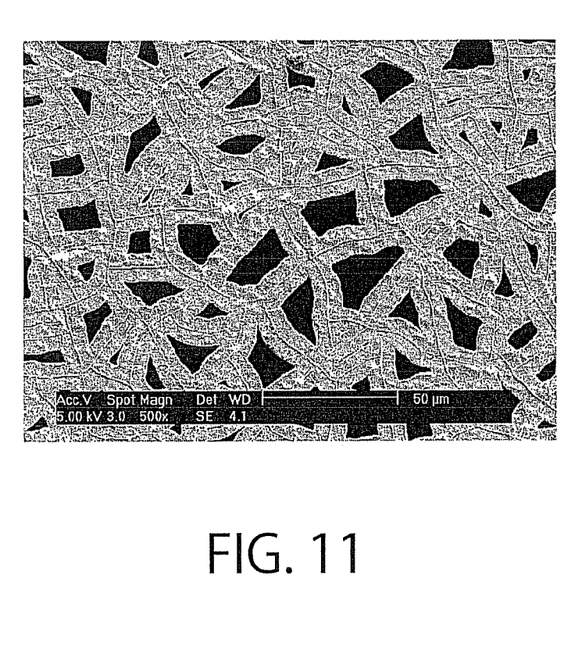
FIG. 11 is an FE-SEM image obtained in Example B2 by observing the surface which contacted the peelable layer of the porous metal foil according to the present invention, from straight above (at a tilt angle of 0°).

The porous metal foil obtained in Example B1 was observed by a field emission-scanning electron microscope (FE-SEM) from different angles. At the outset, the side which had not been in contact with the peelable layer of the porous metal foil (hereinafter, growth side) was observed from straight above (at a tilt angle of 0°) to obtain an image shown in FIG. 10. After the porous metal foil was turned back, the other side which had been in contact with the peelable layer of the porous metal foil (hereinafter, peelable side) was also observed from straight above (at a tilt angle of 0°) to obtain an image shown in FIG. 11. As is clear from these figures, beaded irregularities derived from the spherical parts of the metal particles was observed on the growth side, while a plane derived from the bottom part of the metal particles and center lines formed along the cracks were observed on the peelable side. The fiber diameter (thickness) of the metal fiber was 11 μm as calculated by using the scales shown in these figures. The ratio of the maximum cross-sectional height H to the fiber diameter D at the cross-sectional surface of the metal fiber was calculated to be about 0.50. The number of pores per unit area was about 2000 mm$^{-2}$. The largest pore area observed was about 462 μm$^2$, while the ratio of the number of pores having pore areas not more than one-half of the largest pore area (i.e., not more than about 231 μm$^2$) to the number of the total pores was about 97%.

Example B3

Measurement of Aperture Ratio

The aperture ratio of the porous metal foil obtained in Example B1 was determined by weight method in the following manner. At the outset, the thickness of the porous metal foil was measured to be 6.4 μm by a digital length measuring system (Digimicro MH-15M manufactured by Nikon Corporation). In this measurement, MS-5C (manufactured by Nikon Corporation) was used as a measuring stand, while a spindle which is the standard equipment of Digimicro MH-15M was used. The unit weight per 100 mm×100 mm square of the foil was measured to be 0.450 g. On the other hand, the theoretical weight of a non-porous silver foil having a thickness of 6.4 μm and an area of 100 mm×100 mm square was calculated to be 0.672 g, using the silver density of 10.49 g/cm$^3$. With these values, the aperture ratio of the porous metal foil was calculated to be 33% as shown below.

$$\text{(Aperture ratio)} = 100 - [(\text{Unit weight of the sample})/$$
$$(\text{Theoretical weight of the non-porous copper foil})] \times 100$$
$$= 100 - [(0.450)/(0.672)] \times 100$$
$$= 33\%$$

The invention claimed is:

1. A porous metal foil comprising a two-dimensional network structure composed of a metal fiber, wherein the metal fiber is composed of numerous metal particles being connected to each other only in a two-dimensional, non-repeating, irregular network when viewed microscopically, wherein the metal particles have hemispherical shapes having spherical parts and bottom parts, the bottom parts of all the metal particles are positioned on a same basal plane, and the spherical parts of all the metal particles are positioned to a same side with reference to the basal plane.

2. The porous metal foil according to claim 1, having an aperture ratio P of 3 to 80%, wherein the aperture ratio P is defined as:

$$P = 100 - [(W_p/W_n) \times 100]$$

wherein $W_p/W_n$ is a ratio of a weight $W_p$ of the porous metal foil to a theoretical weight $W_n$ of a non-porous metal foil having a composition and a size which are identical to those of the porous metal foil.

3. The porous metal foil according to claim 2, wherein the aperture ratio is 5 to 60%.

4. The porous metal foil according to claim 2, wherein the aperture ratio is 10 to 55%.

5. The porous metal foil according to claim 1, wherein the metal fiber has a fiber diameter of 5 to 80 μm.

6. The porous metal foil according to claim 1, wherein the metal fiber is a branched fiber, wherein the branched fiber is irregularly networked.

7. The porous metal foil according to claim 1, having a thickness of 3 to 40 μm.

8. The porous metal foil according to claim 1, wherein the two-dimensional network structure has an irregular shape derived from a crack, wherein the crack has been formed on a surface of a substrate.

9. The porous metal foil according to claim 1, wherein the metal fiber comprises at least one selected from the group consisting of copper, aluminum, gold, silver, nickel, cobalt, and tin.

10. A porous metal foil product comprising:
an electrically conductive substrate;
a peelable layer provided on the electrically conductive substrate; and
the porous metal foil according to claim 1 provided on the peelable layer,
wherein the peelable layer allows the porous metal foil to be peeled off from the peelable layer.

11. The porous metal foil according to claim 1, wherein the metal fiber has a fiber diameter of 5 to 50 µm.

12. The porous metal foil according to claim 1, having a thickness of 3 to 30 µm.

13. A method for producing a porous metal foil, comprising the steps of:
forming a peelable layer on an electrically conductive substrate, wherein a crack is generated in the peelable layer; and
plating the peelable layer with a metal capable of depositing preferentially on the crack, to grow numerous metal particles along the crack, so that the porous metal foil comprising a two-dimensional network structure composed of a metal fiber is formed, wherein the metal fiber is composed of numerous metal particles being connected to each other only in a two-dimensional non-repeating, irregular network when viewed microscopically, wherein the metal particles have hemispherical shapes having spherical parts and bottom parts, the bottom parts of all the metal particles are positioned on a same basal plane, and the spherical parts of all the metal particles are positioned to a same side with reference to the basal plane.

14. The method according to claim 13, further comprising the step of peeling off the porous metal foil from the peelable layer.

15. The method according to claim 13, wherein the crack generates due to a stress in the peelable layer.

16. The method according to claim 13, wherein the peelable layer comprises at least one selected from the group consisting of chromium, titanium, tantalum, niobium, nickel and tungsten or is composed of an organic material.

17. The method according to claim 13, wherein the peelable layer is composed of chromium, a chromium alloy or a chromium oxide.

18. The method according to claim 13, wherein the metal capable of depositing preferentially on the crack comprises at least one selected from the group consisting of copper, aluminum, gold, silver, nickel, cobalt, and tin.

19. The method according to claim 13, wherein the peelable layer has a thickness of 1 nm to 100 µm.

20. The method according to claim 13, wherein the porous metal foil has a thickness of 3 to 40 µm.

* * * * *